United States Patent
Shibata et al.

(10) Patent No.: US 8,063,543 B2
(45) Date of Patent: Nov. 22, 2011

(54) PIEZOELECTRIC THIN FILM ELEMENT INCLUDING UPPER AND LOWER ELECTRODES, AND AN ACTUATOR AND A SENSOR FABRICATED BY USING THE SAME

(75) Inventors: Kenji Shibata, Tsukuba (JP); Fumihito Oka, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 330 days.

(21) Appl. No.: 12/453,929

(22) Filed: May 27, 2009

(65) Prior Publication Data

US 2009/0236944 A1 Sep. 24, 2009

(51) Int. Cl.
*H01L 41/187* (2006.01)
(52) U.S. Cl. ........................................ 310/358
(58) Field of Classification Search ............... 310/358; 252/62.9 R, 62.9 PZ; 257/347; 501/134
See application file for complete search history.

(56) References Cited

U.S. PATENT DOCUMENTS

| | | | | |
|---|---|---|---|---|
| 4,917,810 A * | 4/1990 | Tsunooka et al. | ........ | 252/62.9 R |
| 6,526,984 B1 * | 3/2003 | Nilsson et al. | ................ | 128/898 |
| 7,323,806 B2 * | 1/2008 | Shibata et al. | ................ | 310/358 |
| 7,482,736 B2 * | 1/2009 | Ueno et al. | ................ | 310/358 |
| 7,710,003 B2 * | 5/2010 | Shibata et al. | ................ | 310/358 |
| 7,884,531 B2 * | 2/2011 | Shibata et al. | ................ | 310/358 |
| 7,902,730 B2 * | 3/2011 | Shibata et al. | ................ | 310/358 |
| 2008/0308762 A1 * | 12/2008 | Ueno et al. | ............... | 252/62.9 R |

FOREIGN PATENT DOCUMENTS

| | | | |
|---|---|---|---|
| JP | 9-94955 | | 4/1997 |
| JP | 2006-151796 | | 6/2006 |
| JP | 2007317853 A | * | 12/2007 |
| JP | 2008127244 A | * | 6/2008 |
| JP | 2008270379 A | * | 11/2008 |
| JP | 2008270514 A | * | 11/2008 |
| JP | 2008305916 A | * | 12/2008 |

* cited by examiner

*Primary Examiner* — Jaydi San Martin
(74) *Attorney, Agent, or Firm* — McGinn IP Law Group, PLLC

(57) ABSTRACT

A piezoelectric thin film element includes a substrate, a lower electrode, a piezoelectric thin film, and an upper electrode. The lower electrode, the piezoelectric thin film and the upper electrode are formed on the substrate. The piezoelectric thin film includes a polycrystal thin film including crystal grains, an alkali niobium oxide based perovskite structure represented by a general formula: $(K_{1-x}Na_x)NbO_3$ ($0.4<x<0.7$), a film thickness of not less than 1 μm and not more than 10 μm, a columnar structure configured by the crystal grains, a majority of the crystal grains including a shape in a cross-section direction thereof longer than in a plane direction of the substrate, and an average crystal grain size of not less than 0.1 μm and not more than 1.0 μm in the plane direction of the substrate.

5 Claims, 5 Drawing Sheets

1 SILICON SUBSTRATE
2 PLATINUM LOWER ELECTRODE
3 (Na$_{0.5}$K$_{0.5}$)NbO$_3$ PIEZOELECTRIC THIN FILM
13 (Na$_{0.5}$K$_{0.5}$)NbO$_3$ PIEZOELECTRIC THIN FILM

- 4 PLATINUM UPPER ELECTRODE
- 3 $(K_{0.5}Na_{0.5})NbO_3$ PIEZOELECTRIC THIN FILM
- 2 PLATINUM LOWER ELECTRODE
- 1 SILICON SUBSTRATE

1 SUBSTRATE
3,13 PIEZOELECTRIC THIN FILM
61 SAMPLE
62 CLAMP
63 LASER DOPPLER DISPLACEMENT GAUGE

PIEZOELECTRIC THIN FILM ELEMENT INCLUDING UPPER AND LOWER ELECTRODES, AND AN ACTUATOR AND A SENSOR FABRICATED BY USING THE SAME

The present application is based on Japanese patent application No. 2006-346586 filed Dec. 22, 2006, the entire contents of which are incorporated herein by reference.

BACKGROUND OF THE INVENTION

1. Field of the Invention

This invention relates to a piezoelectric thin film element that uses a piezoelectric thin film having an alkali niobium oxide based perovskite structure.

2. Description of the Related Art

A piezoelectric substance is fabricated to various piezoelectric thin film elements according to various purposes, and particularly, is widely used as functional electronic parts such as an actuator to be deformed by application of voltage and a sensor to generate voltage due to the deformation of the piezoelectric thin film element adversely.

As the piezoelectric substance used for the actuator and the sensor, a dielectric substance including a lead based material having an excellent piezoelectric property, especially, a $Pb(Zr_{1-x}Ti_x)O_3$ based ferroelectric substance of perovskite type called "PZT" has been widely used, and generally, it is manufactured by that an oxide including the respective constituent elements is sintered.

Currently, as various electronic parts become more downsized and upgraded, piezoelectric elements have been also strongly requested for the downsizing and upgrading. Piezoelectric materials fabricated by mainly using a sintering method which is a conventional method have a problem that as the thicknesses of the materials become thinner, especially, they becomes close to almost 10 µm, they become close to the crystal grain size constituting the materials, so that the influence thereof can not been ignored.

Therefore, a problem occurs that variation and deterioration of property become remarked, and recently a method of forming the piezoelectric substance to which a thin film technology and the like to take place of the sintering method is applied has been investigated in order to eliminate the problem. Nowadays, the PZT thin film formed by a sputtering method has been put into practice use as an actuator for a head of high-definition and high-speed ink-jet printer (Patent Literature 1).

On the other hand, a piezoelectric sintered body and a piezoelectric thin film made of the above-mentioned PZT includes approximately 60 to 70 weight % of lead oxide (PbO), so that it is not preferable in terms of ecological viewpoint and pollution control. Therefore, it is needed to develop a piezoelectric substance not containing lead in response to environment protection. Lately, various lead-free piezoelectric materials are investigated, and of the materials, potassium sodium niobate (the general formula: $(K_{1-x}Na_x)NbO_3$ (0<x<1)) is known (Patent Literature 2). This material of potassium sodium niobate is a material that has a perovskite structure and shows a relatively good piezoelectric property of the lead-free piezoelectric materials, so that it is expected as the best hope of the lead-free piezoelectric materials.

Patent Literature 1: JP-A-H09 (1997)-94955
Patent Literature 2: JP-A-2006-151796

However, although at present the material of potassium sodium niobate of the sintered body shows high piezoelectric constant (piezoelectric constant $d_{31}$ is not less than −100 pm/V), the material of potassium sodium niobate of thin film realizes only less than half that of the sintered body.

SUMMARY OF THE INVENTION

Therefore, it is an object of the invention to provide a piezoelectric thin film element of potassium sodium niobate having a high piezoelectric constant, and an actuator and a sensor produced by using the piezoelectric thin film element.

(1) According to one embodiment of the invention, a piezoelectric thin film element, a piezoelectric thin film element comprises:
 a substrate;
 a lower electrode;
 a piezoelectric thin film; and
 an upper electrode,
 wherein the lower electrode, the piezoelectric thin film and the upper electrode are formed on the substrate, and
 wherein the piezoelectric thin film comprises:
 a polycrystal thin film including crystal grains;
 an alkali niobium oxide based perovskite structure represented by a general formula: $(K_{1-x}Na_x)NbO_3$ (0.4<x<0.7);
 a film thickness of not less than 1 µm and not more than 10 µm;
 a columnar structure configured by the crystal grains, a majority of the crystal grains including a shape in a cross-section direction thereof longer than in a plane direction of the substrate; and
 an average crystal grain size of not less than 0.1 µm and not more than 1.0 µm in the plane direction of the substrate.

In the above embodiment (1), the following modifications and changes can be made.
 (i) The piezoelectric thin film comprises a pseudocubic or tetragonal polycrystal thin film and is preferentially oriented in a plane orientation (001).
 (ii) The substrate comprises a silicon substrate, and the lower electrode comprises a platinum electrode.
(2) According to another embodiment of the invention, an actuator is produced by using the piezoelectric thin film element according to the above embodiment (1).
(3) According to another embodiment of the invention, a sensor is produced by using the piezoelectric thin film element according to the above embodiment (1).

Advantages of the Invention

According to the invention, a piezoelectric thin film element can be provided, that is a thin film made of a lead-free material and has excellent piezoelectric property, although it is regarded as difficult to realize the element.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
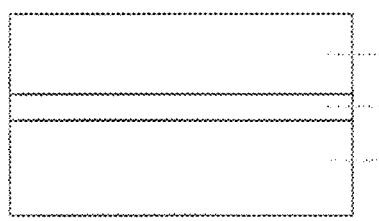
FIG. 1 is a cross-sectional view schematically showing a structure of piezoelectric thin film of $(K_{0.5}Na_{0.5})NbO_3$ used in one embodiment of a piezoelectric thin film element according to the invention.

The preferred embodiments according to the invention will be explained below referring to the drawings.

As a result of the investigation of a correlation between parameters of potassium sodium niobate thin film and the piezoelectric constant by the inventors, it is found that the piezoelectric constant highly depends on the crystal grain size of the thin film while the piezoelectric constant somewhat depends on the composition and film thickness of the thin film. That is, one reason why high piezoelectric constant can not be obtained in the thin film of potassium sodium niobate is probably that the crystal grain size (not more than 0.1 μm) of the thin film is smaller than that (not less than 2 μm) of the sintered body. In order to apply the piezoelectric thin film to finished products, the thin film is requested to have a value of piezoelectric constant $d_{31}$ of not less than −100 pm/V.

Consequently, a piezoelectric thin film element of one embodiment according to the present invention has a characteristic feature that the potassium sodium niobate thin film used in the element has the crystal grain size specified to an appropriate range as means for solving the problem that the piezoelectric constant of the potassium sodium niobate thin film is small.

Particularly, the piezoelectric thin film element have a structure that at least a lower electrode, a piezoelectric thin film and an upper electrode are disposed on a substrate in this order, and the piezoelectric thin film includes a thin film having an alkali niobate perovskite structure represented by the general formula: $(K_{1-x}Na_x)NbO_3$ (0.4<x<0.7). And the film thickness of the piezoelectric thin film is not less than 1 μm and not more than 10 μm. The piezoelectric thin film is a polycrystal thin film, and the piezoelectric thin film is adjusted and controlled so as to have a columnar structure configured by the crystal grains constituting the thin film, a majority of the crystal grains having shapes longer in the cross-sectional direction than in the plane direction of the substrate, and the crystal grains having average crystal grain sizes of not less than 0.1 μm and not more than 1.0 μm in the plane direction of the substrate.

The reason why the crystal grains are defined so as to have average crystal grain sizes of not less than 0.1 μm and not more than 1.0 μm in the plane direction of the substrate of the piezoelectric thin film, that if the sizes are less than 0.1 μm or more than 1.0 μm, a problem may arise that such excellent piezoelectric constant $d_{31}$ as not less than −100 pm/V can not be obtained.

The reason why the piezoelectric constant of the thin film is decreased if the crystal grain sizes thereof are more than 1.0 μm, while the piezoelectric constant of the sintered body can be obtained as an excellent value if the crystal grain sizes are not less than 2 μm, can be considered as follows. In case of the thin film, the thickness of the piezoelectric substance existing between the electrodes is thin (normally, thickness of 2 μm to 5 μm), so that if the crystal grain sizes become more than 1.0 μm, leakage current flows to the place which is intrinsically to be electrically insulated by the thin film, this leakage current causes a loss, and the piezoelectric constant is decreased. The reason why the thin film is defined so as to have the film thickness of not less than 1 μm and not more than 10 μm, that if the thickness is less than 1 μm, a problem may arise that such excellent piezoelectric constant $d_{31}$ as not less than −100 pm/V can not be obtained, and if the thickness is more than 10 μm, a probability may be elevated, that interface delamination (film separation) occurs at the interface between the lower electrode and the piezoelectric thin film due to compression stress applied to the thin film during the film formation. As to the compositional parameter "x" in the general formula: $(K_{1-x}Na_x)NbO_3$, it has been already confirmed that the advantages of the present invention can be achieved if the parameter "x" is included in the range (0.4<x<0.7). Further, although the potassium sodium niobate crystal in the piezoelectric thin film has a probability that it becomes a pseudocubic, a tetragonal or an orthorhombic perovskite structure, it has been already confirmed that the advantages of the present invention can be also achieved if it is a pseudocubic or a tetragonal polycrystal and is preferentially oriented in a plane orientation (001).

Hereinafter, a method of fabricating a piezoelectric thin film used in one embodiment according to the present invention will be explained.

The piezoelectric thin film used in the embodiment according to the present invention, that is, the potassium sodium niobate thin film can be obtained by, for example, forming a platinum lower electrode singularly oriented in a plane orientation (111) on a silicon substrate of a plane orientation (100) by using the sputtering method, and then forming a potassium sodium niobate $(K_{0.5}Na_{0.5})NbO_3$ thin film which is a pseudocubic or a tetragonal polycrystal and is preferentially oriented in a plane orientation (001) on the platinum lower electrode. When the potassium sodium niobate thin film is formed by using the sputtering method, the crystal grain size of the thin film is adjusted and controlled so as to have average crystal grain size of not less than 0.1 μm and not more than 1.0 μm in the plane direction of the substrate. The thin film growth of the crystal grain having such a relatively large crystal grain size as not less than 0.1 μm and not more than 1.0 μm can be realized by optimizing the, the discharge power, the chamber pressure, the sort of atmosphere gas and the like at the film formation.

There are various sputtering equipments having various device structures so that it seems difficult to assert dogmatically, however, in the sputtering equipment used by the present inventors, the potassium sodium niobate thin film having a relatively large crystal grain can be formed by that the film formation temperature is increased, the discharge power is decreased and the film formation speed is reduced, and the partial pressure ratio of argon (Ar) of the atmosphere gas/oxygen $(O_2)$ is reduced. Further, in the film formation of the sputtering method, the film formation speed becomes almost constant if the film formation is carried out by the same film formation conditions. The film formation time is adjusted by using the above-mentioned characteristic, so that the film thickness becomes within the range of not less than 1 μm and not more than 10 μm. In case of forming the potassium sodium niobate thin film by the sputtering method, the potassium sodium niobate thin film is formed, having almost same composition as that of the sintered body target. Consequently, the composition of the sintered body target is adjusted so that the compositional parameter "x" in the general formula: $(K_{1-x}Na_x)NbO_3$ of the potassium sodium niobate thin film is included in the range (0.4<x<0.7). By forming the thin film as described above, the potassium sodium niobate piezoelectric thin film can be obtained, the thin film being adjusted and controlled so as to have the crystal grain sizes of not less than 0.1 μm and not more than 1.0 μm in the plane direction of the substrate, to have the film thickness of not less than 1 μm and not more than 10 μm, and to have the compositional parameter "x" in the general formula: $(K_{1-x}Na_x)NbO_3$ included in the range (0.4<x<0.7). And, by using the piezoelectric thin film, a piezoelectric thin film element can be obtained, which is made of lead-free materials, and has excellent piezoelectric property, particularly has the value of the piezoelectric constant $d_{31}$ of not less than −100 pm/V.

In the specification, the potassium sodium niobate thin film preferentially oriented in a plane orientation (001) means a state that in the X-ray diffraction measurement (2θ/θ measurement, 20 degrees≦2θ≦70 degrees), the potassium sodium niobate (001) surface diffraction peak intensity and the potassium sodium niobate (002) surface diffraction peak intensity are higher than the potassium sodium niobate (110) surface diffraction peak intensity and the potassium sodium niobate (111) surface diffraction peak intensity. In the specification, the potassium sodium niobate (001) means the diffraction peak in case of 2θ=21 degrees to 23 degrees, the potassium sodium niobate (001) means the diffraction peak in case of 2θ=21 degrees to 23 degrees, the potassium sodium niobate (002) means the diffraction peak in case of 2θ=45 degrees to 47 degrees, the potassium sodium niobate (110) means the diffraction peak in case of 2θ=30 degrees to 32 degrees, and the potassium sodium niobate (111) means the diffraction peak in case of 2θ=37 degrees to 39 degrees. The compositional parameter "x" in the general formula: $(K_{1-x}Na_x)NbO_3$ is calculated from a formula: x=[Na]/([K]+[Na]) where [Na] is an atom concentration percentage of Na, and [K] is an atom concentration percentage of K respectively obtained by a general $EDX_=$ measurement. The crystal grain size in the plane direction of the substrate can be examined by an electron backscattered diffraction (EBSD) measurement from the surface side of potassium sodium niobate thin film. In case of the potassium sodium niobate thin film preferentially oriented in a plane orientation (001), the crystal type, particularly, the pseudocubic, the tetragonal or the orthorhombic crystal, to which the potassium sodium niobate crystal belongs, can be judged from the result of the X-ray diffraction measurement (2θ/θ measurement). When the potassium sodium niobate (002) diffraction peak in the vicinity of 2θ=45 degrees is noted, if two peaks occur it is the orthorhombic crystal, if single peak occurs it is the pseudocubic or the tetragonal crystal. Since the normal X-ray diffraction measurement (2θ/θ measurement) can not determine whether the pseudocubic crystal or the tetragonal crystal, a X-ray diffraction In-plain measurement to measure the crystal lattice constant in the plane direction by making X-ray enter at an extremely low angle is carried out and whether the cubic crystal or rectangular crystal is examined, so that it can be determined whether the pseudocubic crystal or the tetragonal crystal.

In the embodiment, a case that the potassium sodium niobate thin film is formed has been explained as one example, however, a piezoelectric thin film formed by adding some kind of element such as Li to the fundamental composition: $(K_{1-x}Na_x)NbO_3$, where a plurality of elements can be added, is also expected to provide the same advantage. Further, in the embodiment, a case that a silicon substrate is used as the substrate has been explained as one example, however, a glass substrate, a quartz glass substrate, a quartz substrate and a metallic substrate such as a magnesium oxide substrate and a stainless substrate as well as a silicon substrate with thermally-oxidized film and SOI substrate are also expected to provide the same advantage.

EXAMPLES

Example 1

Hereinafter, an example method of fabricating the piezoelectric thin film element including $(K_{0.5}Na_{0.5})NbO_3$ thin film of 3 μm in thickness according to the invention will be described.

As shown in FIG. 1, a silicon substrate 1 of a plane orientation (100), having a thermally-oxidized film of 0.2 μm in thickness on the surface, a circular form of 4 inches in diameter and a thickness of 0.525 mm was used as the substrate. First, a platinum lower electrode 2 singularly oriented in a plane orientation (111) having a thickness of 0.2 μm was formed on the silicon substrate 1 by using a RF magnetron sputtering method, and on the lower electrode 2, $(K_{0.5}Na_{0.5})NbO_3$ thin film 3 preferentially oriented in a plane orientation (001), having the perovskite structure, the pseudocubic or tetragonal polycrystal, and a thickness of 3.0 μm was formed as the piezoelectric thin film by using the RF magnetron sputtering method.

The lower electrode 2 was formed under the condition that a film formation temperature is 700 degrees C., a discharge power is 200 W, Ar atmosphere is used, a chamber pressure is 2.5 Pa and a film formation time is 10 minutes. Further, the $(K_{0.5}Na_{0.5})NbO_3$ thin film 3 was formed under the condition that a $(K_{0.5}Na_{0.5})NbO_3$ sintered body target is used, a substrate temperature is 600 degrees C., the discharge power is 100 W, Ar atmosphere is used, the chamber pressure is 0.05 Pa and a film formation time is 2 hours and 30 minutes.

Comparative Example 1

Hereinafter, for comparison, a comparative example method of fabricating the piezoelectric thin film element including $(K_{0.5}Na_{0.5})NbO_3$ thin film of 3 μm in thickness according to a conventional art will be described.

Figure 2:
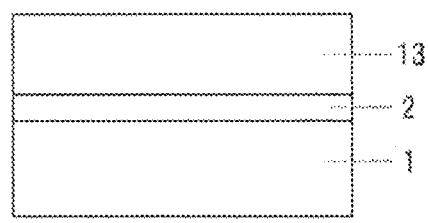
FIG. 2 is a cross-sectional view schematically showing a structure of piezoelectric thin film of $(K_{0.5}Na_{0.5})NbO_3$ used in the conventional piezoelectric thin film element.

As shown in FIG. 2, a silicon substrate 1 of a plane orientation (100), having a thermally-oxidized film of 0.2 μm in thickness on the surface, a circular form of 4 inches in diameter and a thickness of 0.525 mm was used as the substrate. First, a platinum lower electrode 2 singularly oriented in a plane orientation (111) having a thickness of 0.2 μm was formed on the silicon substrate 1 by using a RF magnetron sputtering method, and on the lower electrode 2, $(K_{0.5}Na_{0.5})NbO_3$ thin film 3 preferentially oriented in a plane orientation (001), having the perovskite structure, the pseudocubic or tetragonal polycrystal, and a thickness of 3.0 μm was formed as the piezoelectric thin film by using the RF magnetron sputtering method.

The platinum lower electrode 2 was formed under the condition that a film formation temperature is 700 degrees C., a discharge power is 200 W, Ar atmosphere is used, a chamber pressure is 2.5 Pa and a film formation time is 10 minutes. Further, the $(K_{0.5}Na_{0.5})NbO_3$ thin film 3 was formed under the general condition that a $(K_{0.5}Na_{0.5})NbO_3$ sintered body target is used, a substrate temperature is 600 degrees C., the discharge power is 100 W, Ar (90%)/$O_2$ (10%) atmosphere is used, the chamber pressure is 0.05 Pa and a film formation time is 3 hours and 30 minutes.

Figure 3:
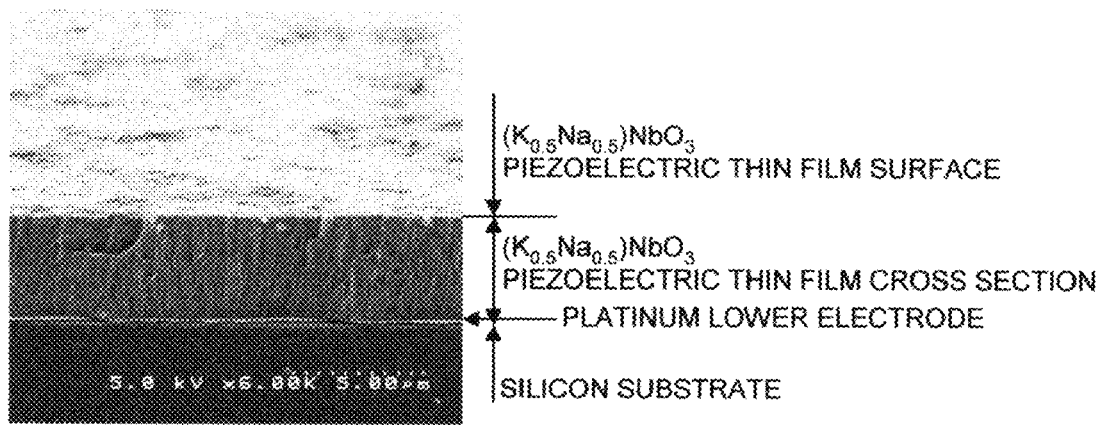
FIG. 3 is an observational view schematically showing a surface of piezoelectric thin film of $(K_{0.5}Na_{0.5})NbO_3$ used in one embodiment of the piezoelectric thin film element according to the invention.
Figure 4:
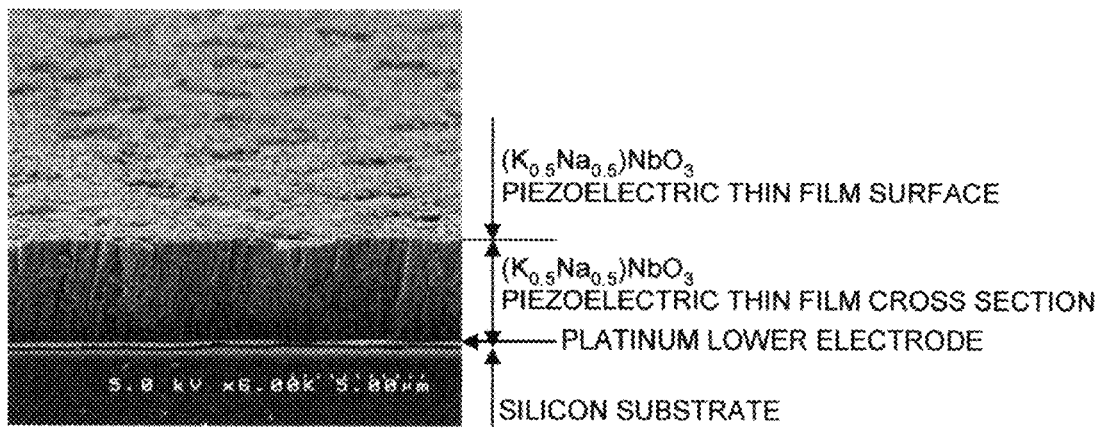
FIG. 4 is an observational view schematically showing a surface of piezoelectric thin film of $(K_{0.5}Na_{0.5})NbO_3$ used in a conventional piezoelectric thin film element.

First, the surfaces and the cross-sectional surfaces of these $(K_{0.5}Na_{0.5})NbO_3$ piezoelectric thin films were observed with an electron microscope. FIG. 3 is an observational view showing the $(K_{0.5}Na_{0.5})NbO_3$ piezoelectric thin film used in the piezoelectric thin film element according to the invention, and FIG. 4 is an observational view showing the $(K_{0.5}Na_{0.5})NbO_3$ piezoelectric thin film used in a conventional piezoelectric thin film element. As seen from the FIGS. 3 and 4, both of the $(K_{0.5}Na_{0.5})NbO_3$ thin films respectively have a columnar structure that a majority of the crystal grains constituting the piezoelectric thin film have a shape longer in the thickness direction (the cross-sectional direction) than in the plane direction of the substrate.

Figure 5:
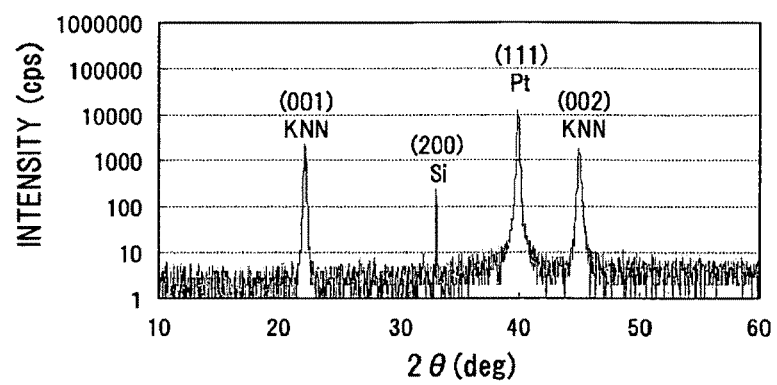
FIG. 5 is a X-ray diffraction pattern of a piezoelectric thin film of $(K_{0.5}Na_{0.5})NbO_3$ used in one embodiment of the piezoelectric thin film element according to the invention.
Figure 6:
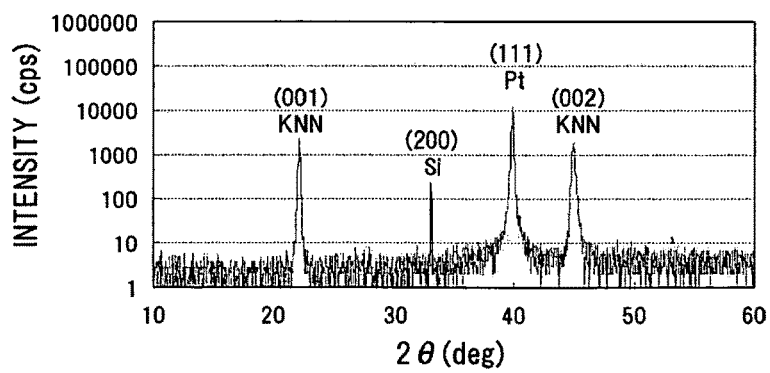
FIG. 6 is a X-ray diffraction pattern of a piezoelectric thin film of $(K_{0.5}Na_{0.5})NbO_3$ used in a conventional piezoelectric thin film element.

Further, in order to examine the crystal structure and the orientation condition of the $(K_{0.5}Na_{0.5})NbO_3$ piezoelectric thin films, the X-ray diffraction measurement (2θ/θ measurement) was carried out. FIG. 5 is a X-ray diffraction pattern of the $(K_{0.5}Na_{0.5})NbO_3$ piezoelectric thin film used in the piezoelectric thin film element according to the invention and FIG. 6 is a X-ray diffraction pattern of the $(K_{0.5}Na_{0.5})NbO_3$ piezoelectric thin film used in the conventional piezoelectric thin film element. As seen from the FIGS. 5 and 6, both of the $(K_{0.5}Na_{0.5})NbO_3$ thin films are respectively a pseudocubic or tetragonal polycrystal thin film (it is impossible to distinguish between the pseudocubic crystal and the tetragonal crystal only by using the 2θ/θ measurement) and are preferentially oriented in a plane orientation (001).

Next, the crystal grain conditions of these $(K_{0.5}Na_{0.5})NbO_3$ piezoelectric thin films in the plain direction of the substrate were measured by using the EBSD.

Figure 7:
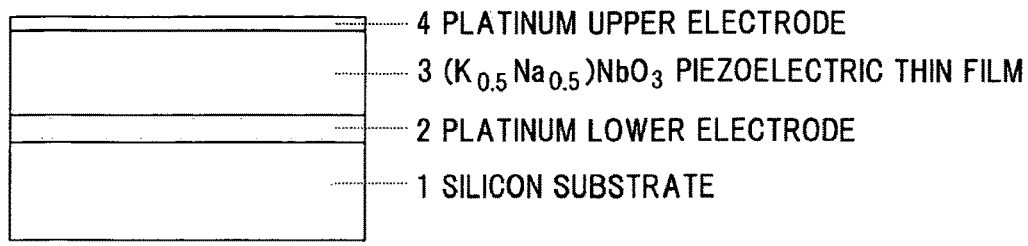
FIG. 7 is a cross-sectional view schematically showing a structure of one embodiment of the piezoelectric thin film element according to the invention fabricated by using the $(K_{0.5}Na_{0.5})NbO_3$ piezoelectric thin film.

The measurement condition of the EBSD is as follows. A thermal field emission type scanning electron microscope (FTE-SEM) manufactured by JEOL Ltd. under model number JSM-6500F and an OIM orientation analysis device (DigiView II (DVC 1412M) slow scan CCD camera, OIM Data Collection ver. 4.6x, OIM Analysis ver.4.6x) manufactured by TSL were used. The analysis was carried out under the condition that an accelerating voltage is 15.0 kV, an irradiation current 1.0 nA, a sample gradient is 70 degrees, a measurement magnification is 10000-fold magnification, a measurement region is 8×16 µm, and a measurement interval 25 nm/step. As the measurement object, the $(K_{0.5}Na_{0.5})NbO_3$ piezoelectric thin film on which a platinum upper electrode of almost 20 nm in thickness is formed by using the RF magnetron sputtering method was used (See FIG. 7) and the measurement was carried out from the surface side. At the time of analysis, if there was an angular difference of the crystal orientation of not less than 5 degrees between neighboring regions, it was considered that the crystal grains are different from each other, and a crystal grain size distribution in the whole measurement region was obtained. The platinum upper electrode 4 was formed under the condition that the substrate is not heated, the discharge power is 200 W, Ar atmosphere is used, and the film formation time is 1 minute.

The evaluation results by the EBSD of the crystal grain sizes of the $(K_{0.5}Na_{0.5})NbO_3$ piezoelectric thin films used in the piezoelectric thin film elements according to the present invention and the conventional art are shown in Tables 1 and 2.

TABLE 1

| Grain size (µm) | Area fraction |
| --- | --- |
| 0.025 | 0.000 |
| 0.075 | 0.005 |
| 0.125 | 0.090 |
| 0.175 | 0.104 |
| 0.225 | 0.340 |
| 0.275 | 0.200 |
| 0.325 | 0.090 |
| 0.375 | 0.042 |
| 0.425 | 0.030 |
| 0.475 | 0.032 |
| 0.525 | 0.029 |
| 0.575 | 0.017 |
| 0.625 | 0.005 |
| 0.675 | 0.006 |
| 0.725 | 0.007 |
| 0.775 | 0.003 |
| 0.825 | 0.000 |
| 0.875 | 0.000 |
| 0.925 | 0.000 |
| 0.975 | 0.000 |

Average crystalline grain size: 0.202 µm

TABLE 2

| Grain size (µm) | Area fraction |
| --- | --- |
| 0.025 | 0.110 |
| 0.075 | 0.262 |
| 0.125 | 0.137 |
| 0.175 | 0.103 |
| 0.225 | 0.079 |
| 0.275 | 0.070 |
| 0.325 | 0.062 |
| 0.375 | 0.042 |
| 0.425 | 0.030 |
| 0.475 | 0.032 |
| 0.525 | 0.029 |
| 0.575 | 0.017 |
| 0.625 | 0.005 |
| 0.675 | 0.006 |
| 0.725 | 0.007 |
| 0.775 | 0.000 |
| 0.825 | 0.009 |
| 0.875 | 0.000 |
| 0.925 | 0.000 |
| 0.975 | 0.000 |

Average crystalline grain size: 0.045 µm

As seen from the results, the $(K_{0.5}Na_{0.5})NbO_3$ piezoelectric thin film used in the piezoelectric thin film element according to the conventional art has the average crystal grain size of 0.045 µm in the plane direction of the substrate, while the $(K_{0.5}Na_{0.5})NbO_3$ piezoelectric thin film used in the piezoelectric thin film element according to the present invention has the average crystal grain size of 0.202 µm in the plane direction of the substrate, which is almost a five-fold size comparing with the size relating to the conventional art.

Next, the piezoelectric properties of the piezoelectric thin film elements according to the present invention and the conventional art are compared.

Figure 8:
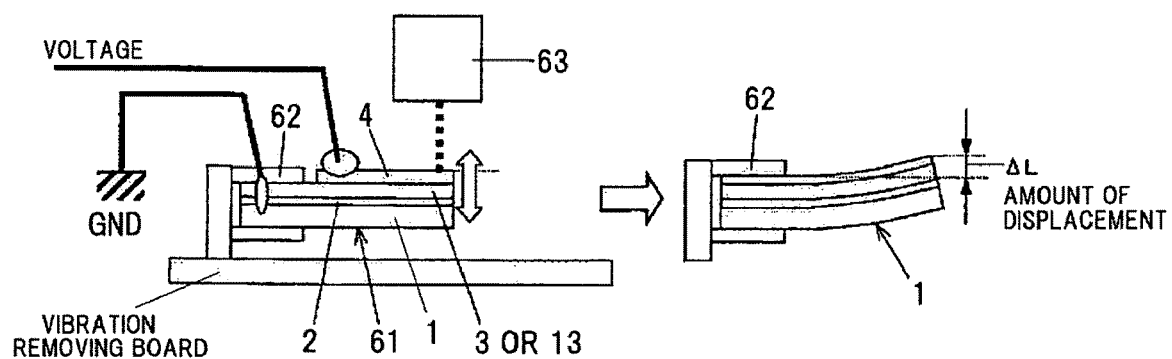
FIG. 8 is an explanatory view schematically showing an evaluation method of the piezoelectric property.

First, a sample 61 having a strip-shape of 15 to 20 mm in length and 2.5 mm in width was clipped from the piezoelectric properties of the piezoelectric thin film elements, and the longitudinal edge of the sample 61 was fixed by a clamp 62 so that simplified unimorph cantilever type was formed. In this condition, voltage was applied to the $(K_{0.5}Na_{0.5})NbO_3$ piezoelectric thin films 3 (or 13) between both the electrodes 2, 4, so that the $(K_{0.5}Na_{0.5})NbO_3$ piezoelectric thin films 3 (or 13) was lengthened and shortened and the whole of the cantilever performed flexion exercise, and the end of the lever was operated. The end displacement ΔL was measured by using a laser Doppler displacement gauge 63 (See FIG. 8).

Figure 9:
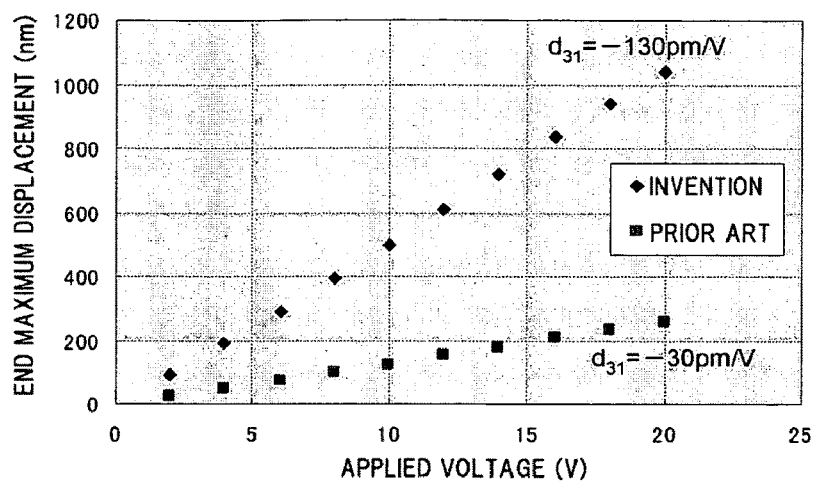
FIG. 9 is a graph schematically showing a relationship between applied voltage and end maximum displacement in the piezoelectric thin film elements of one embodiment of the invention and the conventional art.

FIG. 9 shows a relationship between applied voltage and the end maximum displacement in the piezoelectric thin film elements of one embodiment of the present invention and the conventional art. It is recognized that the amount of the cantilever end displacement due to the piezoelectric action in the piezoelectric thin film element of the present invention becomes almost four-fold in comparison with the piezoelectric thin film element of the conventional art. The piezoelectric constant $d_{31}$ of the piezoelectric thin film is calculated from amount of the cantilever end displacement, cantilever length, thickness and Young's modulus of the substrate and the thin film, and applied voltage. The calculation method of the piezoelectric constant $d_{31}$ was carried out according to a method described in the non-patent literature (T. Mino, S. Kuwajima, T. Suzuki, I. Kanno, H. Kotera, and K. Wasa: Jpn. J. Appl. Phys. 46 (2007) 6960). Young's modulus of the piezoelectric thin film and the silicon substrate was calculated by using 104 GPa and 168 GPa.

As a result of calculating the piezoelectric constant $d_{31}$ of both the samples from the relationship between the applied voltage and the amount of piezoelectric displacement, the piezoelectric constant $d_{31}$ of the piezoelectric thin film element of the conventional art was −30 pm/V and the piezoelectric constant $d_{31}$ of the piezoelectric thin film element of the present invention was −130 pm/V (at the time when voltage of 20V was applied). From the above description, it was confirmed that the present invention can provide a $(K_{0.5}Na_{0.5})NbO_3$ piezoelectric thin film having the piezoelectric constant of not less than four-fold in comparison with that of the thin film of the conventional art.

Example 2

A plurality of $(K_{0.5}Na_{0.5})NbO_3$ piezoelectric thin films were fabricated, whose average crystal grain sizes in the plane direction of the substrate were changed by variously changing the conditions of sputtering film formation of the $(K_{0.5}Na_{0.5})NbO_3$ thin film (the thickness was fixed to 3 μm), and the respective piezoelectric constants $d_{31}$ were measured by using the method shown in Example 1.

Figure 10:
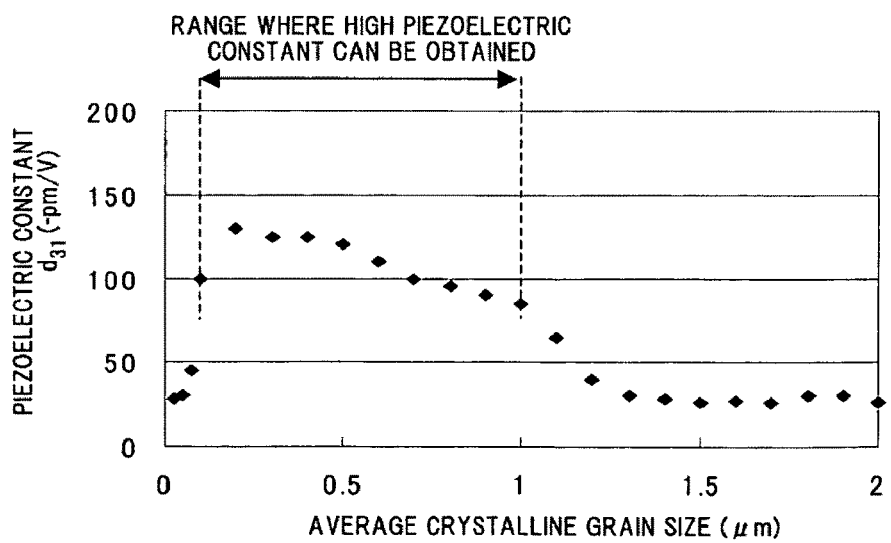
FIG. 10 is a graph schematically showing a relationship between average crystal grain size and piezoelectric constant $d_{31}$ of the $(K_{0.5}Na_{0.5})NbO_3$ piezoelectric thin films.

FIG. 10 shows a relationship between average crystal grain size and the piezoelectric constant $d_{31}$ of the $(K_{0.5}Na_{0.5})NbO_3$ piezoelectric thin films. It is recognized that if the average crystal grain size of the $(K_{0.5}Na_{0.5})NbO_3$ piezoelectric thin film is within the range of 0.1 μm to 1.0 μm, preferably 0.1 μm to 0.7 μm, high piezoelectric constant $d_{31}$ (not less than −100 pm/V) can be obtained. Based on the above, the average crystal grain size of the $(K_{0.5}Na_{0.5})NbO_3$ piezoelectric thin film according to the invention was determined.

Example 3

$(K_{1-x}Na_x)NbO_3$ piezoelectric thin films (where the compositional parameter "x" is within the range of 0.4 to 0.7, the film thicknesses are within the range of 1 μm to 10 μm) were formed by the RF magnetron sputtering method and average crystal grain sizes in the plane direction of the substrate were examined respectively, and then the piezoelectric constants $d_{31}$ were measured respectively by using the method shown in Example 1. The relationship between the average crystal grain size and the piezoelectric constant $d_{31}$ of the $(K_{0.5}Na_{0.5})NbO_3$ piezoelectric thin film is shown in Table 3.

TABLE 3

| Average crystalline grain size (μm) | Piezoelectric constant $d_{31}$ (−pm/V) | | | | |
|---|---|---|---|---|---|
| | Film thickness 3 μm (x = 0.5) | Film thickness 1 μm | Film thickness 5 μm | Film thickness 10 μm | Film thickness not less than 10 μm |
| 0.025 | 28 | | 40 (x = 0.42) | | |
| 0.050 | 30 | 33 (x = 0.61) | | | |
| 0.075 | 45 | | | 50 (x = 0.49) | film separation |
| 0.1 | 100 | 85 (x = 0.40) | | | film separation |
| 0.2 | 130 | | 110 (x = 0.62) | | |
| 0.3 | 125 | 100 (x = 0.55) | | 123 (x = 0.68) | |
| 0.4 | 125 | | | | |
| 0.5 | 120 | 98 (x = 0.70) | | | |
| 0.6 | 110 | | | 121 (x = 0.42) | film separation |
| 0.7 | 100 | | | | |
| 0.8 | 95 | | 118 (x = 0.58) | | |
| 0.9 | 90 | 90 (x = 0.52) | | | |
| 1.0 | 85 | | | 99 (x = 0.56) | |
| 1.1 | 65 | | 49 (x = 0.70) | | |
| 1.2 | 40 | | | 60 (x = 0.42) | |
| 1.3 | 30 | | | film separation | |
| 1.4 | 28 | | 33 (x = 0.51) | | |
| 1.5 | 26 | | | film separation | |
| 1.6 | 27 | | | | |
| 1.7 | 26 | | | | film separation |
| 1.8 | 30 | | | | |
| 1.9 | 30 | | | | |
| 2.0 | 26 | | | | |

From the results, it can be confirmed that if the compositional parameter "x" is within the range of 0.4 to 0.7 and the average crystal grain size of the $(K_{0.5}Na_{0.5})NbO_3$ piezoelectric thin film is within the range of 0.1 μm to 1.0 μm, there is an tendency that high piezoelectric constant $d_{31}$ can be obtained. Further, it can be confirmed that if the film thickness is within the range of 1 μm to 10 μm and the average crystal grain size of the $(K_{0.5}Na_{0.5})NbO_3$ piezoelectric thin film is within the range of 0.1 μm to 1.0 μm, there is an tendency that high piezoelectric constant $d_{31}$ can be obtained. However, if the film thickness is more than 10 μm, interface delamination may occur at the interface between the $(K_{1-x}Na_x)NbO_3$ piezoelectric thin film and the platinum lower electrode. It is expected that the reason why the interface delamination occurs is due to that the more the film thickness is enlarged, the more the stress applied to the thin film during the film formation or stress applied to the thin film after the film formation (stress due to a difference of coefficient of thermal expansion from that of the substrate) is increased.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A piezoelectric thin film element, comprising:
 a substrate;
 a lower electrode;
 a piezoelectric thin film; and
 an upper electrode,
  wherein the lower electrode, the piezoelectric thin film and the upper electrode are formed on the substrate, and
  wherein the piezoelectric thin film comprises:
   a polycrystal thin film including crystal grains;
   an alkali niobium oxide based perovskite structure represented by a general formula: $(K_{1-x}Na_x)NbO_3$, wherein $0.4<x<0.7$;
   a film thickness of not less than 1 μm and not more than 10 μm;
   a columnar structure configured by the crystal grains, a majority of the crystal grains including a length in a cross-section direction thereof longer than in a plane direction of the substrate; and
   an average crystal grain size of not less than 0.1 μm and not more than 1.0 μm in the plane direction of the substrate.

2. The piezoelectric thin film element according to claim 1, wherein the piezoelectric thin film comprises a pseudocubic or tetragonal polycrystal thin film and is dominantly oriented in a plane orientation (001).

3. The piezoelectric thin film element according to claim 1, wherein the substrate comprises a silicon substrate, and the lower electrode comprises a platinum electrode.

4. An actuator produced by using the piezoelectric thin film element according to claim 1.

5. A sensor produced by using the piezoelectric thin film element according to claim 1.

* * * * *